United States Patent [19]
Davies et al.

[11] Patent Number: 5,920,102
[45] Date of Patent: Jul. 6, 1999

[54] SEMICONDUCTOR DEVICE HAVING A DECOUPLING CAPACITOR AND METHOD OF MAKING

[75] Inventors: Robert B. Davies, Tempe; Andreas A. Wild, Scottsdale; Peter J. Zdebel, Mesa, all of Ariz.

[73] Assignee: Motorola, Inc., Schaumburg, Ill.

[21] Appl. No.: 08/867,663

[22] Filed: May 30, 1997

[51] Int. Cl.⁶ .............................. H01L 29/76; H01L 29/94
[52] U.S. Cl. .......................... 257/401; 257/382; 257/623
[58] Field of Search ................................... 257/382, 401, 257/623

[56] References Cited

U.S. PATENT DOCUMENTS

| | | | |
|---|---|---|---|
| 4,198,252 | 4/1980 | Hsu | 148/187 |
| 4,371,955 | 2/1983 | Sasaki | 365/185 |
| 4,697,198 | 9/1987 | Komori et al. | 357/23.3 |
| 4,759,822 | 7/1988 | Vetanen et al. | 156/644 |
| 4,796,070 | 1/1989 | Black | 257/409 |
| 5,021,845 | 6/1991 | Hashimoto | 357/23.4 |
| 5,082,794 | 1/1992 | Pfiester et al. | 437/40 |
| 5,366,913 | 11/1994 | Nakao | 437/41 |
| 5,395,773 | 3/1995 | Ravindhran et al. | 437/27 |
| 5,420,067 | 5/1995 | Hsu | 437/180 |
| 5,429,956 | 7/1995 | Shell et al. | 437/29 |
| 5,434,093 | 7/1995 | Chau et al. | 437/41 |
| 5,489,543 | 2/1996 | Hong | 437/41 |
| 5,656,842 | 8/1997 | Iwamatsu et al. | 257/329 |

OTHER PUBLICATIONS

IEDM Technical Digest, "International Electron Devices Meeting, 1993", Washington, DC, Dec. 5–8, 1993, pp. 6.5.1–6.5.4.

IEDM Technical Digest, International Electron Devices meeting, 1994, San Francisco, CA, Dec. 11–14, 1994, pp. 4.1.1–4.1.4.

*Transactions on Electron Devices* vol. ED–20, No. 3, Mar. 1973, "Computer Analysis of the Double–Difused MOS Transistor for Integrated Circuits", Hung Chang Lin and Wesley N. Jones, pp. 275–282.

*Primary Examiner*—Valencia Martin-Wallace
*Attorney, Agent, or Firm*—Kenneth M. Seddon; Daniel R. Collopy

[57] ABSTRACT

A semiconductor device (10) is formed in a pedestal structure (16) overlying an epitaxial layer (12) and a semiconductor substrate (11). The semiconductor device (10) includes a doped region (13) that forms a PN junction with the epitaxial layer (12). The semiconductor device (10) also includes a dielectric layer (22) that has an opening (23) that exposes a portion of the doped region (13) and an opening (24) that exposes a portion of the epitaxial layer (12). The openings (23, 24) are filled with a conductive material (36, 37) to provide contacts (100, 101). Due to the presence of the PN junction, the contacts (100, 101) are capacitively coupled to each other.

27 Claims, 5 Drawing Sheets

SEMICONDUCTOR DEVICE HAVING A DECOUPLING CAPACITOR AND METHOD OF MAKING

BACKGROUND OF THE INVENTION

This invention relates, in general, to semiconductor devices, and more particularly, to insulated gate field effect transistors for low power applications.

Semiconductor devices such as insulated gate field effect transistors (IGFETs) are becoming increasingly important in low voltage applications. As IGFET devices are scaled to smaller and smaller dimensions, manufacturers must refine transistor designs to maintain optimum device performance. These performance considerations include power consumption, leakage current, reliability during operation, breakdown voltage, etc.

One significant performance consideration is the relatively high current consumption as the result of charging and discharging power supply lines. During operation, the parasitic capacitance characteristic of the power supply lines becomes a limiting factor in the maximum frequency that a transistor can operate at. One previously known attempt at addressing this limitation places discrete capacitors in parallel with the power supply lines to increase the amount of charge that is available at the instant a transistor conducts. However, this alternative is not practical in a high volume manufacturing operation due to the expense and reliability issues associated with discrete capacitors.

Accordingly, a need exists to provide a semiconductor device that has improved performance characteristics and is more reliable than devices known in the art.

Figure 1:
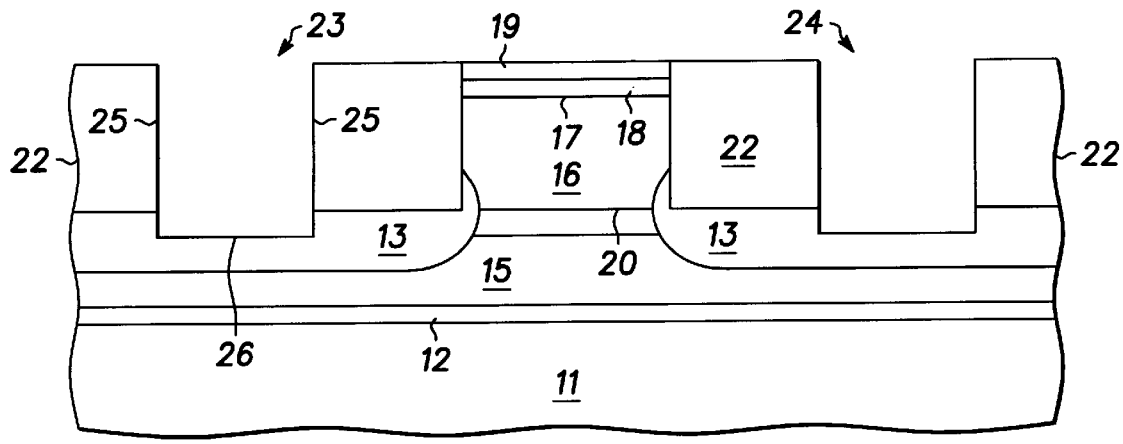
FIGS. 1–3 are enlarged cross-sectional views of a semiconductor device at various stages in a manufacturing process in accordance with the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

FIG. 1 is an enlarged cross-sectional view of a semiconductor device 10 at an early stage of a manufacturing process in accordance with the present invention. As shown in the example that follows, semiconductor device 10 is in a p-channel configuration. One skilled in the art will appreciate that an n-channel device can be formed by changing n-type regions to p-type regions and vice versa.

Semiconductor device 10 is formed over a semiconductor substrate 11, which is preferably of p-type conductivity having a doping concentration in excess of about $1 \times 10^{18}$ atoms/centimeter$^3$ (cm$^3$). A layer of epitaxial material, hereinafter referred to as epitaxial layer 12, is formed on semiconductor substrate 11 using conventional processing techniques. Preferably, epitaxial layer 12 has a thickness ranging from about 0.5 microns to 3 microns and has a p-type doping concentration ranging from about $1 \times 10^{15}$ atoms cm$^3$ to $1 \times 10^{16}$ atoms/cm$^3$. The actual thickness of epitaxial layer 12 depends on the particular performance characteristics desired for semiconductor device 10. In general, epitaxial layer 12 acts as a doped region that provides a portion of a PN junction as explained below.

A second layer of epitaxial material (not shown) is then formed on epitaxial layer 12, which is used to provide a pedestal structure 16 as explained below. Preferably, this second layer of epitaxial material has an n-type doping concentration ranging from about $1 \times 10^{15}$ atoms cm$^3$ to $5 \times 10^{16}$ atoms/cm$^3$. It should also be understood that, if desired, a single epitaxial layer could be used to form semiconductor device 10.

A hard mask comprising a single or a sequence of dielectric layers is then formed to define the location of pedestal structure 16. For example, as shown in FIG. 1, the hard mask comprises a layer of silicon nitride 19 over a layer of thermal oxide 18, hereinafter referred to as thermal oxide layer 18. These layers can be formed using a conventional Low Pressure Chemical Vapor Deposition (LPCVD) Process, a Plasma Enhanced Chemical Vapor Deposition (PECVD) Process, a thermal oxidation process, or similar technique. The hard mask is formed by using a photolithographic pattern and etch process to pattern silicon nitride layer 19 and thermal oxide layer 18 such as is shown in FIG. 1. A Reactive Ion Etch (RIE) process is then used to remove the exposed portions of the second epitaxial layer to provide pedestal structure 16, which has an upper surface 17.

Pedestal structure 16 is then used as an implant mask to form doped regions 13. For example, an n-type dopant such as arsenic is implanted into the exposed portions of epitaxial layer 12 at an energy ranging from about 50 keV to 150 keV and a dose ranging from about $1 \times 10^{15}$ atoms/centimeter$^2$ (cm$^2$) to $5 \times 10^{15}$ atoms/cm$^2$. Note that the implanted species does not enter pedestal structure 16 due to the presence of the dielectric material over the upper surface 17 of pedestal structure 16. It should be understood that it may be desirable to form protective sidewall spacers using silicon nitride over silicon dioxide and using the thermal oxide as a preimplant screen oxide to prevent the implant dopant from doping the sidewalls of pedestal structure 16. A layer of dielectric material 22, hereinafter referred to as dielectric layer 22, is formed over pedestal structure 16 and a surface 20 of semiconductor substrate 11. Dielectric layer 22 is preferably made from densified tetraethylorthosilicate (TEOS) and is polished so that it is planar with silicon nitride layer 19.

A blanket implant process is then performed to form a doped region 15 in epitaxial layer 12. A p-type dopant such as boron is implanted into epitaxial layer 12 with an energy ranging from about 400 keV to 700 keV and a dose ranging from about $1 \times 10^{12}$ atoms/cm$^2$ to $3 \times 10^{13}$ atoms/cm$^2$. An anneal or subsequent high temperature processing is used to activate the implanted dopant and to form doped regions 13 and 15 such as is shown in FIG. 1. Doped regions 13 and 15 form a PN junction, a portion of which extends under pedestal structure 16. It should be noted that a portion of doped region 13 may diffuse into pedestal structure 16 as shown in FIG. 1.

An opening 23 and an opening 24 are then formed through dielectric layer 22 using a photolithographic pattern and an RIE etch to complete the processing as shown in FIG. 1. Opening 23 provides sidewalls 25 along dielectric layer 22 and a bottom surface 26 that exposes a portion of doped region 13.

Figure 2:
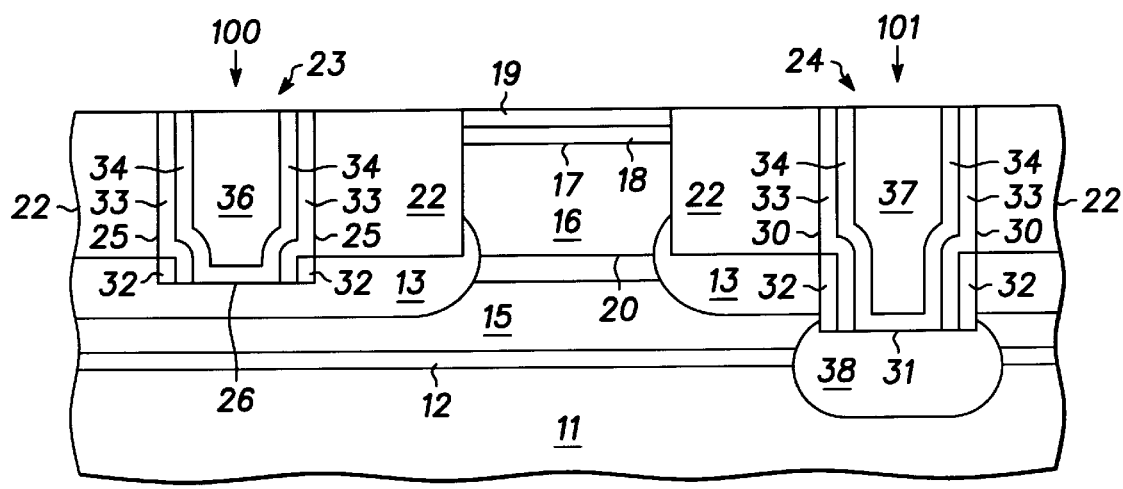

FIG. 2 is an enlarged cross-sectional view of semiconductor device 10 after further processing. In particular, FIG. 2 illustrates the formation of contacts 100 and 101. A photolithographic masking and an RIE etch process are performed to further extend opening 24 as shown in FIG. 2. Opening 24 has sidewalls 30 that run along dielectric layer 22 and that expose portions of doped regions 13 and 15 (i.e., sidewalls 30 are coterminous with the doped regions 13 and 15). Opening 24 also has a bottom surface 31 that exposes or terminates in doped region 15. If desired, opening 24 could be extended so that bottom surface is at the interface between semiconductor substrate 11 and epitaxial layer 12, or opening 24 could extend into semiconductor substrate 11.

In an optional step, the same photolithographic mask used to extend opening 24 is used as an implantation mask to form a doped region 38. A p-type dopant such as boron is implanted through bottom surface 31 of opening 24. Doped region 38 is formed to insure that the conductive material 37 that is to be formed in opening 24 (see below) is in electrical contact with doped region 15. The use of doped region 38 should be considered optional and may be desirable if the bottom surface of opening 24 is formed such that it extends below doped region 15 and into either epitaxial layer 12 or semiconductor substrate 11.

As mentioned above, sidewalls 30 expose a portion of doped regions 13 and 15. To provide electrical isolation between the conductive material to be formed in openings 23 and 24, a thermal oxidation process is used to form a layer of dielectric material 32, such as silicon dioxide, over the exposed portions of doped regions 13 and 15. Preferably, dielectric layer 32 is about 200 angstroms (Å) to 750 Å thick. Another layer of dielectric material 33, such as silicon nitride, is then formed over dielectric layer 32 and along the sidewalls 25 and 30 of openings 23 and 24, respectively. An LPCVD process can be used to form dielectric layer 33 so that it has a thickness ranging from about 500 Å to 1500 Å. Dielectric layer 33 is used to facilitate the formation of conductive material in openings 23 and 24 and its use is considered optional. An anisotropic etch is then used to remove dielectric layer 33 over the bottom surface 31 of opening 24, thereby exposing a portion of dielectric layer 32. A wet etch is used to remove the exposed portions of dielectric layer 32.

Additionally, a layer of oxidation retarding material 34, such as polysilicon, may be formed adjacent to the sidewalls 25 and 30 of openings 23 and 24. Layer of oxidation retarding material 34 is used to retard the diffusion of oxygen into conductive material 36 and 37. The use of layer of oxidation retarding material 34 is optional and depends on the susceptibility of conductive material 36 and 37 to the diffusion of oxygen. For example, if conductive material 36 and 37 contain tungsten, then the use of layer of oxidation retarding material 34 may be required to prevent damage to conductive material 36 and 37.

Conductive material 36 and 37 can comprise a variety of materials including tungsten, polysilicon, cobalt, chromium, other refractory metals, and the like. Conventional Chemical Vapor Deposition (CVD), LPCVD, or sputtering techniques can be used to fill openings 23 and 24 with conductive material 36 and 37, respectively. As shown in FIG. 2, conductive material 36 is electrically connected to doped region 13 as it is in physical contact with layer of oxidation retarding material 34 which in turn is in contact with doped region 13. Furthermore, conductive material 37 is in electrical contact only with doped region 15 because dielectric layer 32 provides electrical isolation between conductive material 37 and doped region 13.

Therefore, conductive material 36 of contact 100 is capacitively coupled to conductive material 37 of contact 101 due to the electrical isolation that is provided by dielectric layers 32 and 33 and the presence of the PN junction formed by doped regions 13 and 15. In the process steps described below, a field effect transistor is formed in pedestal structure 16. The formation of contacts 100 and 101, as provided above, provides a variety of advantages to the performance of a field effect transistor formed in accordance with the present invention. For example, if contacts 100 and 101 are electrically connected to the power supply voltages (e.g., $V_{dd}$ and $V_{ss}$) then a decoupling capacitor is provided that improves the signal to noise ratio of circuits formed using the semiconductor device. In addition, this capacitive effect improves the alpha particle immunity of the circuits formed using the semiconductor device as the amount of charge near the semiconductor device (i.e. around pedestal structure 16) is increased.

Figure 3:
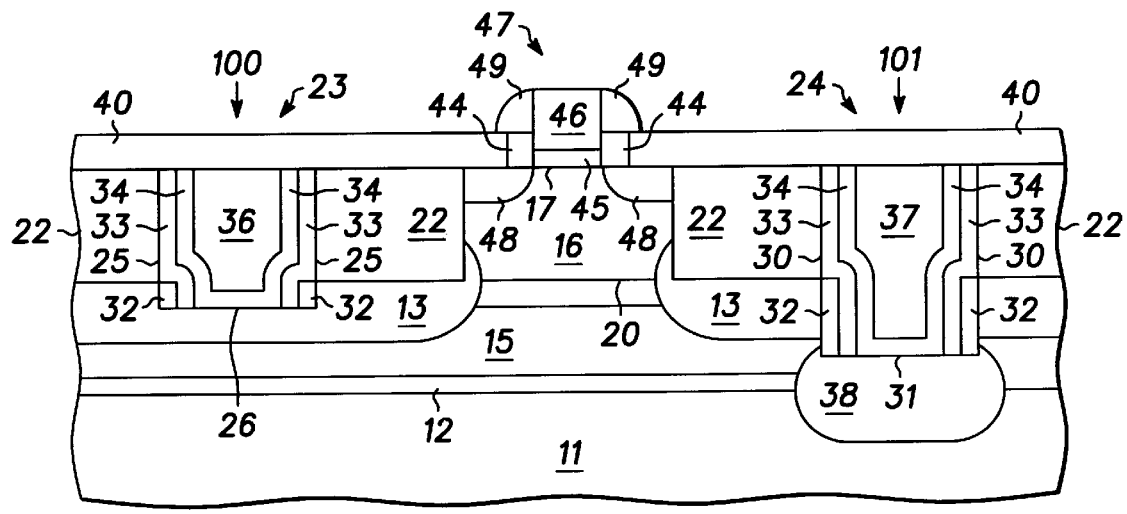

Turning now to FIG. 3, one method of forming semiconductor device 10 in conjunction with contacts 100 and 101 is provided. A variety of techniques can be used to form semiconductor device 10. Simply stated, semiconductor device 10 includes a gate structure 47 that is made of up a gate dielectric layer 45, such a silicon dioxide, and a layer of conductive material 46 such as polysilicon. A conductive layer 40 is formed to electrically connect current carrying electrodes 48 of semiconductor device 10 to contacts 100–101. Preferably, conductive layer 40 is a layer of doped polysilicon, but conductive layer 40 could also be a layer of titanium silicide or similar material. Spacers 44 and 49 are formed from either selective oxidation of conductive layer 40 or from the deposition and etching of dielectric materials such as silicon nitride. Spacers 44 and 49 provide electrical isolation between conductive layer 40 and gate structure 47 of semiconductor device 10.

Figure 4:
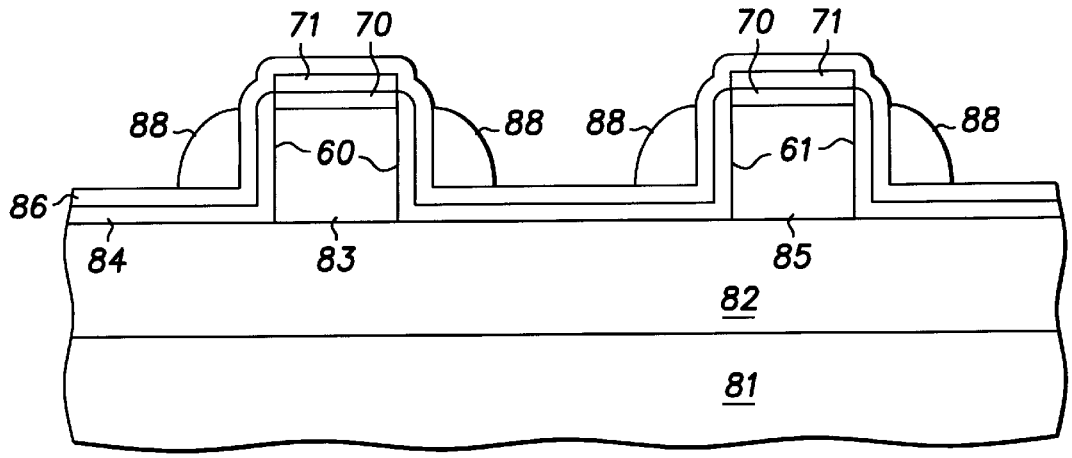
FIGS. 4–8 are enlarged cross-sectional views of a semiconductor device at various stages in a manufacturing process in accordance with an alternate embodiment of the present invention.

FIG. 4 is an enlarged cross-sectional view of an electronic component 80 that is formed in accordance with an alternate embodiment of the present invention. For illustrative purposes, electronic component 80 has two semiconductor devices each formed in its own pedestal structure. This configuration makes electronic component 80 well suited for use as an inverter with the semiconductor device in the first pedestal structure serving as the p-channel device and the semiconductor device in the second pedestal serving as the n-channel device. This alternate embodiment can have application in the formation of other types of electronic components and can also be incorporated into the formation of contacts 100 and 101 as discussed earlier. Simply stated, the process of forming electronic component 80 involves the formation of a PN junction around one of the pedestal structures and the formation of a large decoupling capacitor surrounding both pedestal structures.

Electronic component 80 is formed in a semiconductor substrate 81, which is preferably of p-type conductivity. An epitaxial layer 82 is formed on semiconductor substrate 81. Preferably, epitaxial layer 82 is about 0.5 to 3 microns thick and is of the same conductivity, but a lower doping concentration, than semiconductor substrate 81. As explained in more detail below, epitaxial layer 82 serves as the lower plate in the decoupling capacitor structure that is formed in accordance with the present invention. An additional epitaxial layer (not shown) is formed on epitaxial layer 82 to provide pedestal structures 83 and 85. A hard mask including a layer of silicon dioxide 70 and a layer of silicon nitride 71 are deposited and patterned over the additional epitaxial layer. An RIE etch is then use to form pedestal structures 83 and 85 as shown in FIG. 4.

A thermal oxidation process is then used to form a thermal oxide layer 84 over epitaxial layer 82 and the sidewalls 60 and 61 of pedestal structures 83 and 85, respectively. Preferably, thermal oxide layer 84 is about 200 Å to 1500 Å thick. A layer of silicon nitride, hereinafter referred to as silicon nitride layer 86, is deposited over thermal oxide layer 84 and over silicon nitride layer 71. An LPCVD process can be used to form silicon nitride layer 86 so that it has a thickness ranging from about 500 Å to 2000 Å. A layer of polysilicon (not shown) is deposited and etched using an appropriate RIE etch to form polysilicon sidewall spacers 88 adjacent to pedestal structures 83 and 85 and complete the structure as shown in FIG. 4. A photolithographic mask and etch process are then used to remove polysilicon sidewall spacers 88 adjacent to pedestal structure 83, but polysilicon sidewall spacers 88 adjacent to pedestal structure 85 remain.

Figure 5:
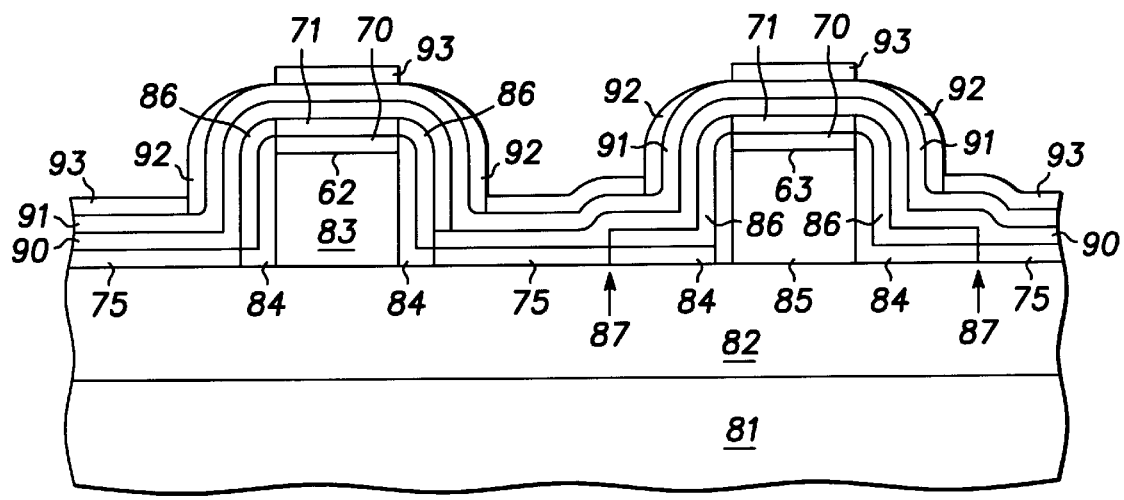

Referring now to FIG. 5, an RIE etch is performed to remove the exposed portions of silicon nitride layer 86. Spacers 88 are then removed using a wet isotropic etch. Then exposed regions of thermal oxide layer 84 are removed using a wet etch such as a solution containing hydrofluoric acid. This exposes portions of epitaxial layer 82 and leaves some portions of silicon nitride layer 86 and thermal oxide layer 84 adjacent to the sidewalls of pedestal structure 83. Due to the presence of polysilicon sidewall spacers 88 during the etch, a portion of silicon nitride layer 86 and thermal oxide layer 84 will remain on epitaxial layer 82 around pedestal structure 85 as shown in FIG. 5. Arrows 87 are used to indicate the edges of the portion of silicon nitride layer 86 and thermal oxide layer 84 that remains. It should be understood that arrows 87 roughly approximate the point to which polysilicon spacers 88 extended away from pedestal structure 85.

A thermal oxide layer 75 is then grown on the exposed surfaces of epitaxial layer 82. Preferably, thermal oxide layer 75 is generally less than about 50 Å thick, but can have a thickness ranging from about 10 Å to 100 Å. A silicon nitride layer 90 is then formed on thermal oxide layer 75 and along the exposed portions of silicon nitride layer 86 and silicon nitride layer 71. Preferably, silicon nitride layer 90 has a thickness ranging from about 50 Å to 500 Å. The combination of thermal oxide layer 75 and silicon nitride layer 90 along the surface of epitaxial layer 82 serves as the dielectric material of the decoupling capacitor of the present invention.

A layer of polysilicon 91 is then deposited on silicon nitride layer 90 including the portions of silicon nitride layer 90 over pedestal structures 83 and 85. Preferably, an LPCVD process is used to form polysilicon layer 91, which preferably has a thickness ranging from about 200 Å to 750 Å and is generally less than about 2,000 Å. A layer of silicon nitride (not shown) is then deposited over polysilicon layer 91 and etched with an RIE etch to form spacers 92 over polysilicon layer 91 along the sidewalls of pedestal structure 83 and 85. A thermal oxidation process is then used to form a layer of silicon dioxide 93, hereinafter referred to as silicon dioxide layer 93, from the exposed portions of polysilicon layer 91 including the portion of polysilicon layer 91 overlying pedestal structure 83 and 85. It should be noted that the presence of spacers 92 over polysilicon layer 91 adjacent to pedestal structure 83 and 85 prevents the covered portions of polysilicon layer 91 from oxidizing. It is also possible to completely oxidize the exposed portions of polysilicon layer 91 if desired.

Figure 6:
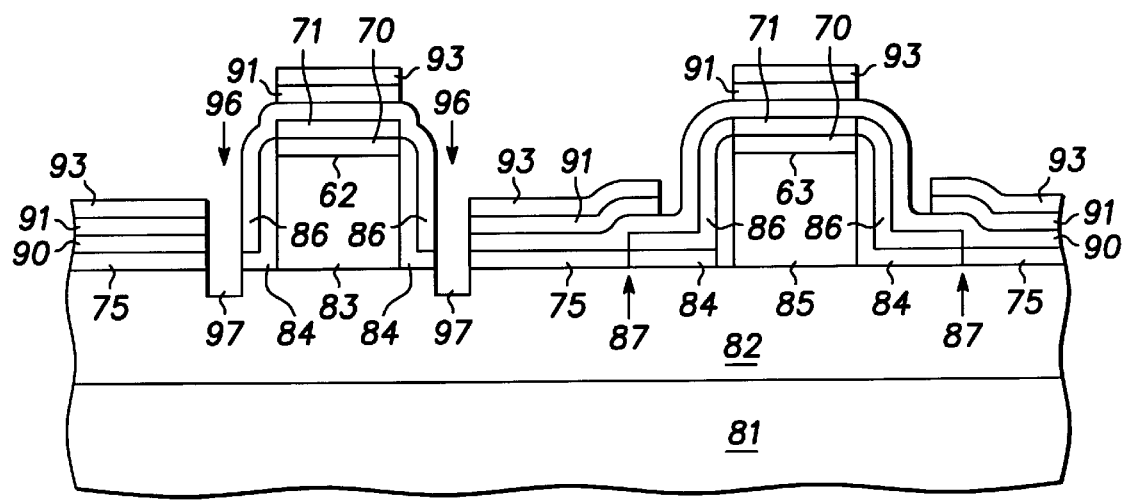

Referring now to FIG. 6, the process of forming electronic component 80 continues with the removal of spacers 92 using a wet isotropic etch such as a solution containing hydrofluoric acid. This etch is then followed by a sequence of dry anisotropic etches that removes the underlying portions of polysilicon layer 91 and thermal oxide layer 75, thereby exposing a portion of the surface of epitaxial layer 82 through openings 96. This etch process can also be allowed to continue to remove a portion of epitaxial layer 82 to form trenches 97 such as is shown in FIG. 6. Due to the presence of thermal oxide layer 84 and silicon nitride layer 86 around pedestal structure 85, epitaxial layer 82 near and around pedestal structure 85 remains covered.

Figure 7:
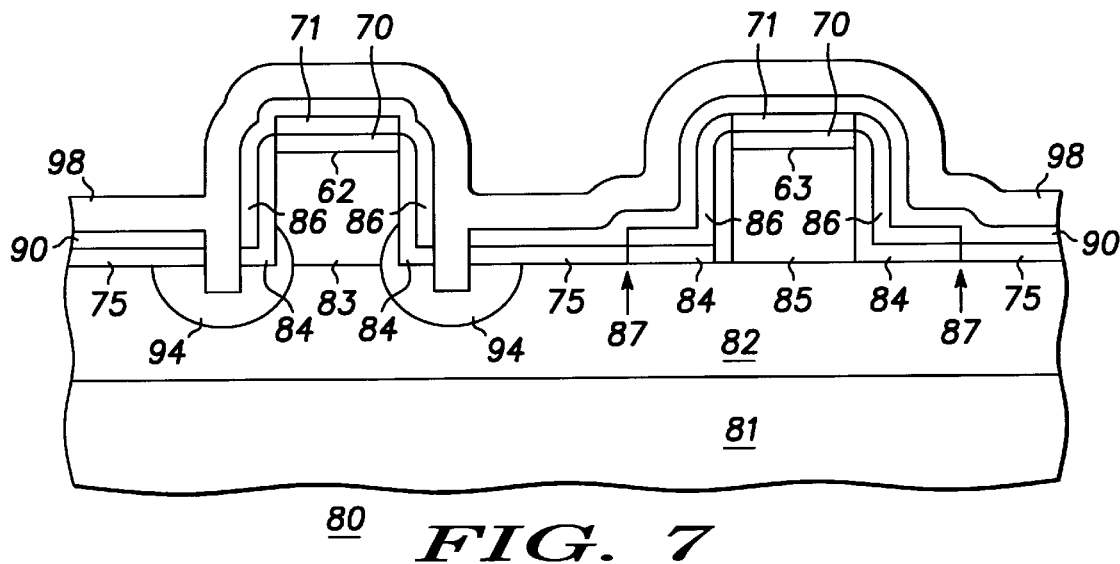

Turning now to FIG. 7, the formation of electronic component 80 continues with the formation of a doped layer 98. As shown in FIG. 7, doped layer 98 fills openings 96 and physically contacts epitaxial layer 12 at trenches 97. Preferably, doped layer 98 is a layer of polysilicon that is doped to an n-type conductivity with a dopant such as arsenic and has a thickness ranging from about 1000 Å to 5000 Å. It should also be understood that to reduce the electrical resistance of doped layer 98, a sequence of layers of different material can be used to provide doped layer 98. For example, doped layer 98 can comprise approximately 500 Å of polysilicon, approximately 2000 Å of tungsten silicide, and approximately 500 Å of polysilicon. A heating or annealing process is then used to diffuse the n-type dopant from doped polysilicon layer 98 into epitaxial layer 82 to form a doped region 94. Doped region 94 forms a PN junction with epitaxial layer 82 and is adjacent to and under a portion of pedestal structure 83. It should be noted that a portion of doped region 94 may diffuse into the lower portions of pedestal structure 83.

Figure 8:
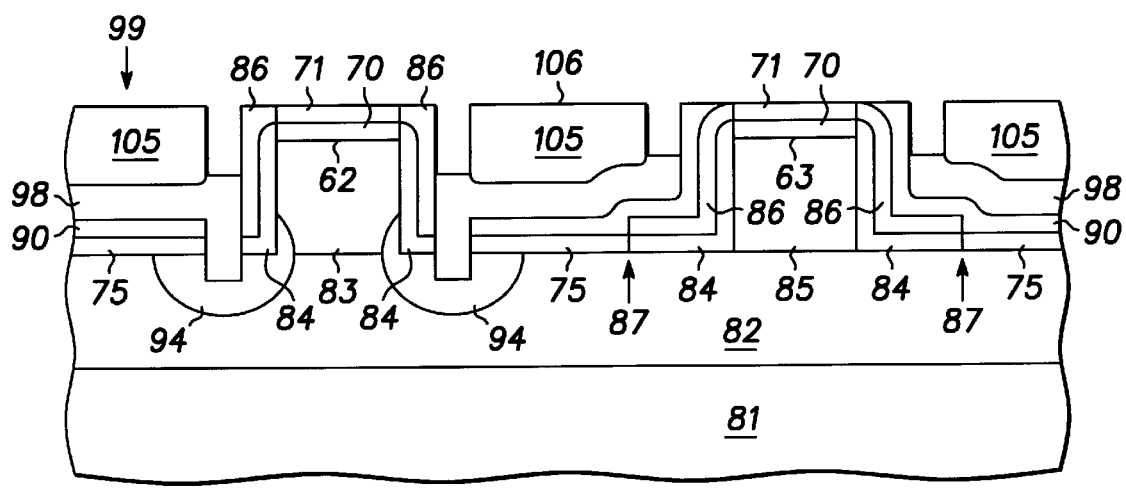

Referring now to FIG. 8, the process for forming electronic component 80 in accordance with the present invention is completed by forming a layer of dielectric material 105 such as densified TEOS. A CMP polishing process is then used to provide a planarized surface 106 and to remove the portions of doped layer 98 over pedestal structures 83 and 85. This will expose a portion of silicon nitride layer 71 or thermal oxide layer 70 to facilitate the formation of semiconductor devices such as field effect transistors in each of pedestal structures 83 and 85. A wet etch or anisotropic etch process can also be used to remove some of doped layer 98 so that doped layer 98 is recessed from surface 106.

Doped layer 98 serves as the upper plate of a decoupling capacitor 99 that is formed in accordance with the present invention. The other portions of decoupling capacitor structure 99 include the combination of thermal oxide layer 75 and silicon nitride layer 90 that serve as the dielectric material and epitaxial layer 82, which serves as the lower conductive plate. One skilled in the art will also appreciate that doped layer 98 is decoupled from epitaxial layer 82 due to the presence of the PN junction formed by doped region 94 and epitaxial layer 82.

One of the advantages of decoupling capacitor structure 99 is that the structure is made up of both an PN junction as well as the parallel plate capacitor structure provided by decoupling capacitor 99. This alternate embodiment offers an advantage over the structure shown in FIGS. 1–3 in that the size or the surface area of the PN junction is significantly smaller, and thus, decoupling capacitor structure 99 typically has less leakage current during operation and at elevated temperatures. Therefore, a semiconductor device or an electronic component that is formed in conjunction with decoupling capacitor structure 99 consumes less power than a semiconductor device formed in conjunction with the first embodiment of the present invention.

Figure 9:
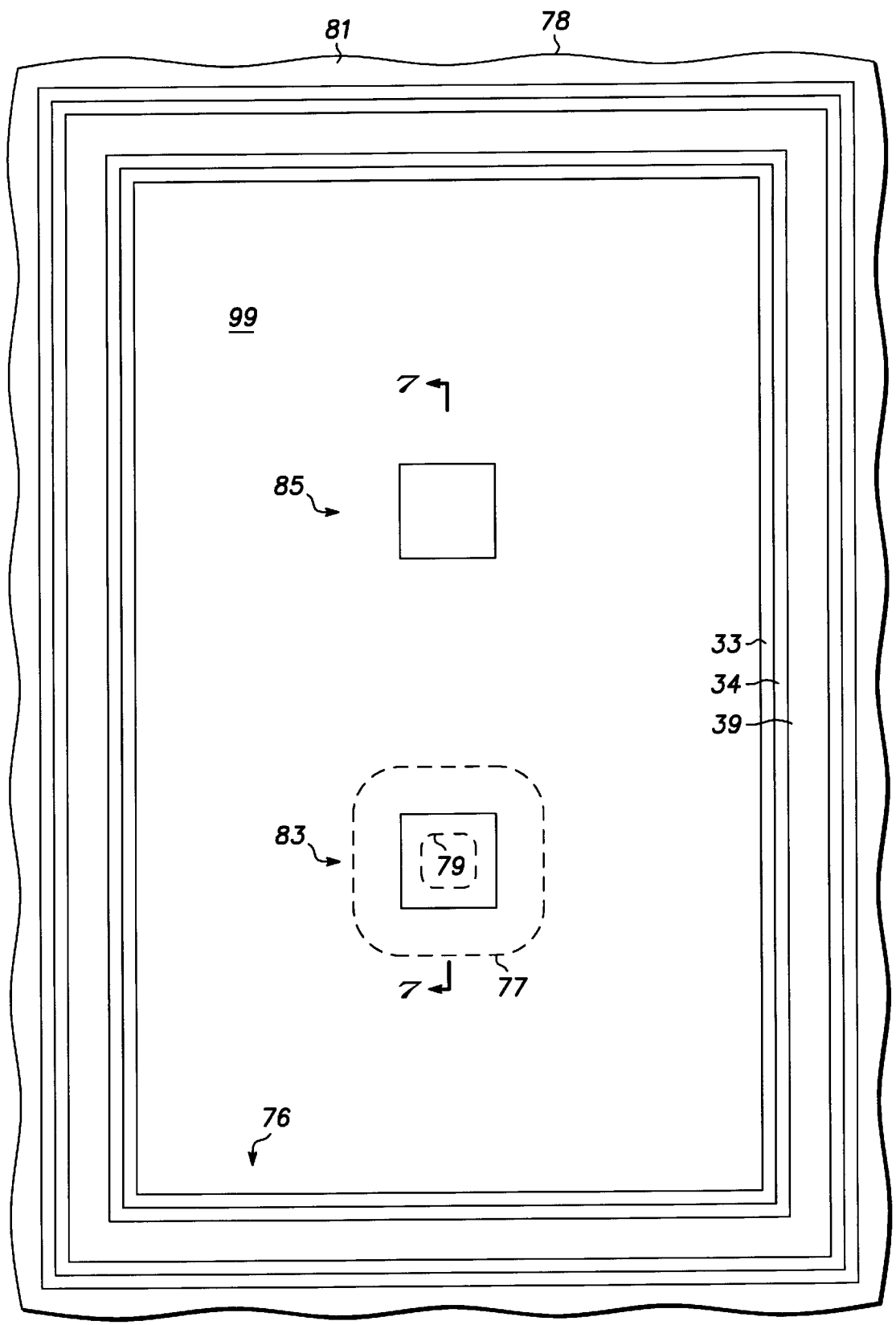
FIGS. 9–10 are enlarged top views of electronic components in accordance with the present invention.

FIG. 9 is an enlarged top view of electronic component 80 and is provided to illustrate the relative placement of doped region 94 (see FIG. 7) relative to pedestal structures 83 and 85. Sectional lines 7—7 are used to illustrate the location of the cross-sectional view that is shown in FIG. 7. A dashed line 77 is used to represent the outer boundaries of doped region 94 around pedestal structure 83 and a dashed line 79 is used to represent the amount that doped region 94 extends under pedestal structure 83. As a result of the processing steps described above, the formation of doped region 94 is limited to the area adjacent to pedestal structure 83 and there is no doped region formed near pedestal structure 85.

Additionally, the process of the present invention forms decoupling capacitor 99 across the entire surface of semiconductor substrate 81. A trench structure 76 can be formed using the processing techniques described earlier in the formation of contacts 100 and 101 to provide an edge termination structure. Trench structure 76 includes a conductive material 39 that is connected to semiconductor substrate 81 and is electrically isolated from the underlying doped region 13 (not shown in FIG. 9) by dielectric layer 33. The formation of trench structure 76 should be considered optional and is formed to delineate the end of decoupling capacitor 99 and to retard the flow of leakage current to the edge 78 of semiconductor substrate 81.

Figure 10:
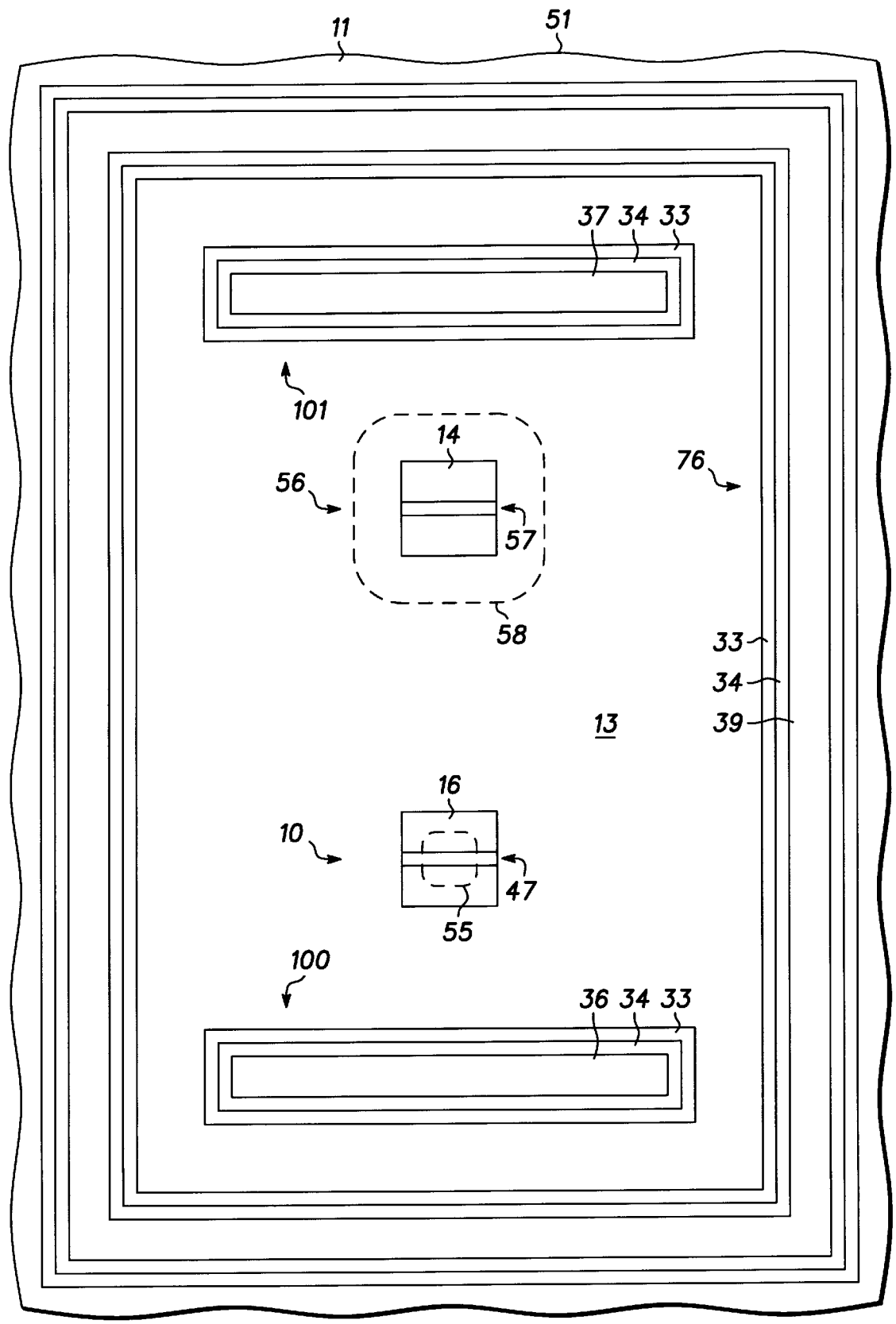

FIG. 10 is an enlarged top view of an electronic component 50 that is formed in accordance with the embodiments of the present invention discussed above, such as those shown in FIGS. 1–3. Electronic component 50 includes many of the same process steps and structural elements described earlier, and where possible, the same element numbers are used to indicate which elements are similar to those described earlier. Electronic component 50 includes semiconductor device 10 in pedestal structure 16 and a semiconductor device 56 that is formed in a pedestal structure 14. Semiconductor devices 10 and 56 each have source and drain regions (not labeled) that are controlled by gate structures 47 and 57 and can be formed using the process described earlier and shown in FIGS. 1–3. Electronic component 50 can also include contact 100, which is electrically connected to doped region 13, and contact 101, which is electrically connected to underlying epitaxial layer 12 and semiconductor substrate 11 (not shown, see FIGS. 1–3).

Electronic component 50 can be configured as an inverter by connecting the source of semiconductor device 10 to contact 100 (and thus, doped region 13) and the source of semiconductor device 56 to contact 101 (and thus, epitaxial layer 12). If a power supply voltage is then placed between doped region 13 and epitaxial layer 12 via semiconductor substrate 11, electronic component 50 is an inverter by using gate structures 47 and 57 as inputs and using the coupled drain regions of semiconductor device 10 and semiconductor device 56 as the output.

Electronic component 50 can also be formed using many of the processing steps shown in FIG. 4 to control and limit the formation of doped region 13 near pedestal structure 14. For example, prior to the doping of epitaxial layer 12 to form doped regions 13, polysilicon spacers 88 (see FIG. 4) can be formed around pedestal structure 14 to prevent the doping of the underlying portions of epitaxial layer 12. A dashed line 55 is then used to represent the boundary of doped region to illustrate how far doped region 13 may extend under pedestal structure 16 and a dashed line 58 is used to illustrate how close doped region 13 gets to pedestal structure 14. In other words, the entire area between dashed line 55 and dashed line 58 is occupied by doped region 13. Electronic component 50 can also include the formation of trench structure 76 (see FIG. 9) to terminate and passivate the edge of the PN junction formed by doped region 13 and epitaxial layer 82 near edge 51 of semiconductor substrate 11. Because the opening (see opening 24, FIG. 2) that is used to form trench structure 76 passes through doped region 13, trench structure 76 also serves to delineate the outer boundary of doped region 13.

Accordingly, the present invention provides several structures that can be formed separately or together to improve performance characteristics of a semiconductor device. It should be understood that the preference for which structures should be formed in combination depends in part on both the manufacturing cost and the desired performance of the semiconductor device.

We claim:

1. A semiconductor device comprising:
   a semiconductor substrate;
   a layer of epitaxial material on the semiconductor substrate, wherein the layer of epitaxial material is doped to a first conductivity and provides a major surface;
   a first doped region in the layer of epitaxial material, wherein the first doped region is of the first conductivity;
   a second doped region in the layer of epitaxial material, wherein the second doped region is of a second conductivity and at least a portion of the second doped region is contiguous with the first doped region to provide a PN junction;
   a first layer of dielectric material overlying the layer of epitaxial material and having a first opening and a second opening, wherein the first opening has sidewalls and a bottom surface that exposes a portion of the second doped region, and the second opening has sidewalls that exposes a portion of the first doped region and the second doped region and also has a bottom surface;
   a second layer of dielectric material along the sidewalls of the first opening and along the sidewalls of the second opening;
   a first conductive material in the first opening that is electrically coupled to the second doped region; and
   a second conductive material in the second opening that is electrically isolated from the second doped region by the second layer of dielectric material and is electrically coupled to the first doped region.

2. The semiconductor device of claim 1 further comprising a layer of oxidation retarding material between the second conductive material and the first layer of dielectric material, wherein the layer of oxidation retarding material retards diffusion of oxygen from the first layer of dielectric material to the second conductive material.

3. The semiconductor device of claim 2 wherein the second conductive material is selected from a group consisting of tungsten, polysilicon, cobalt, and chromium.

4. The semiconductor device of claim 1 wherein the semiconductor substrate is of the first conductivity.

5. The semiconductor device of claim 1 further comprising a pedestal structure overlying the semiconductor substrate.

6. The semiconductor device of claim 5 further comprising a field effect transistor in the pedestal structure.

7. The semiconductor device of claim 5 wherein a portion of the PN junction extends under the pedestal structure.

8. The semiconductor device of claim 1 further comprising a third layer of dielectric material between the second layer of dielectric material and the first conductive material, wherein the third layer of dielectric material is also between the second layer of dielectric material and the second conductive material.

9. The semiconductor device of claim 1 wherein the first conductive material is capacitively coupled to the second conductive material.

10. The semiconductor device of claim 1 further comprising a third doped region in the semiconductor substrate so that at least a portion of the bottom surface of the second opening is contiguous with the third doped region.

11. An electronic component comprising:

a semiconductor substrate:

an epitaxial layer overlying the semiconductor substrate, wherein the epitaxial layer is of a first conductivity;

a first doped region in the semiconductor substrate, wherein the first doped region is of the first conductivity;

a second doped region in the semiconductor substrate, wherein the second doped region is of a second conductivity and forms a PN junction with the first doped region;

a first pedestal structure overlying the epitaxial layer and a portion of the first doped region, wherein a portion of the first pedestal structure is overlying a portion of the second doped region; and a second pedestal structure overlying the epitaxial layer and the first doped region, wherein the second pedestal structure is separated from the second doped region.

12. The electronic component of claim 11 further comprising a dielectric layer overlying the epitaxial layer and having a first opening and a second opening, wherein the first opening has a bottom surface that exposes a portion of the second doped region and the second opening has a bottom surface that exposes a portion of the first doped region.

13. The electronic component of claim 12 further comprising:

a first conductive material in the first opening that is electrically coupled to the second doped region; and a second conductive material in the second opening that is electrically isolated from the second doped region and is electrically coupled to the first doped region.

14. The electronic component of claim 13 further comprising:

a first semiconductor device in the first pedestal structure having a source region and a drain region; and a second semiconductor device in the second pedestal structure having a source region and a drain region, wherein the first conductive material is electrically coupled to the source region of the first semiconductor device and the second conductive material is electrically coupled to the source region of the second semiconductor device.

15. The electronic component of claim 14 wherein the drain region of the first semiconductor device is electrically coupled to the drain region of the second semiconductor device.

16. The electronic component of claim 14 wherein the dielectric layer has a third opening having a bottom surface that exposes a portion of the semiconductor substrate and encompasses the first pedestal structure and the second pedestal structure, and the electronic component further comprises a third conductive material in the third opening that is electrically coupled to the semiconductor substrate.

17. The electronic component of claim 11 wherein the semiconductor substrate is of a p-type conductivity, and a portion of the second doped region extends into the first pedestal structure.

18. The electronic component of claim 17 wherein the second pedestal structure is not overlying any portion of the second doped region.

19. An electronic component comprising:

a semiconductor substrate;

an epitaxial layer overlying the semiconductor substrate, wherein the epitaxial layer is of a first conductivity;

a first doped region in the epitaxial layer, wherein the first doped region is of the first conductivity;

a first pedestal structure overlying the epitaxial layer and a portion of the first doped region, wherein the first pedestal structure is of a second conductivity and has sidewalls;

a second pedestal structure overlying the epitaxial layer and a portion of the first doped region; and a second doped region in the epitaxial layer and adjacent to and encompassing the first pedestal structure, wherein the second doped region is of the second conductivity and forms a PN junction with the first doped region, and wherein a portion of the second doped region extends from the epitaxial layer into the first pedestal structure.

20. The electronic component of claim 19 wherein a portion of the second doped region is under the first pedestal structure.

21. The electronic component of claim 20 wherein a portion of the second doped region is in the first pedestal structure.

22. The electronic component of claim 19 further comprising:

a layer of dielectric material overlying the epitaxial layer; and a layer of conductive material overlying the layer of dielectric material and electrically coupled to the second doped region.

23. The electronic component of claim 22 further comprising a trench structure in the epitaxial layer and adjacent to the first pedestal structure, wherein a portion of the layer of conductive material is in the trench structure.

24. The electronic component of claim 23 wherein the epitaxial layer adjacent to the second pedestal structure is devoid of a trench structure.

25. The electronic component of claim 22 wherein the layer of dielectric material is a layer of silicon dioxide, and the electronic component further comprises a layer of silicon nitride between the layer of silicon dioxide and the layer of conductive material.

26. The electronic component of claim 25 wherein the layer of silicon dioxide has a thickness of less than about 50 angstroms, and the layer of conductive material comprises polysilicon and has a thickness of less than about 3,000 angstroms.

27. The electronic component of claim 19 further comprising:

a trench structure encompassing the first pedestal structure and the second pedestal structure, wherein the trench structure has a bottom surface that exposes a portion of the semiconductor substrate; and a conductive material in the trench structure that is electrically coupled to the semiconductor substrate.

* * * * *